United States Patent [19]
Shida

[11] Patent Number: 6,049,113
[45] Date of Patent: Apr. 11, 2000

[54] SEMICONDUCTOR DEVICE AND SEMICONDUCTOR DEVICE MANUFACTURING METHOD

[75] Inventor: Akira Shida, Tokyo, Japan

[73] Assignee: NEC Corporation, Tokyo, Japan

[21] Appl. No.: 09/199,390

[22] Filed: Nov. 25, 1998

Related U.S. Application Data

[62] Division of application No. 09/092,076, Jun. 5, 1998.

[30] Foreign Application Priority Data

Jun. 5, 1997 [JP] Japan ................................. 9-148015

[51] Int. Cl.[7] .................................................. H01L 29/76
[52] U.S. Cl. ........................... 257/369; 257/371; 257/412
[58] Field of Search .................................. 257/369, 371, 257/412, 413

[56] References Cited

U.S. PATENT DOCUMENTS

| | | | |
|---|---|---|---|
| 3,673,471 | 6/1972 | Klein et al. ............................... | 438/585 |
| 5,021,354 | 6/1991 | Pfiester .................................... | 438/587 |
| 5,278,085 | 1/1994 | Maddox, III et al. .................. | 438/587 |
| 5,567,642 | 10/1996 | Kim et al. ................................ | 438/587 |
| 5,595,922 | 1/1997 | Tigelaar et al. .......................... | 438/587 |

FOREIGN PATENT DOCUMENTS

| | | |
|---|---|---|
| 62-281462 | 12/1987 | Japan . |
| 4-032260 | 2/1992 | Japan . |
| 4032260 | 2/1992 | Japan . |
| 7153847 | 6/1995 | Japan . |
| 8-046057 | 2/1996 | Japan . |
| 9232445 | 9/1997 | Japan . |

*Primary Examiner*—Mark V. Prenty
*Attorney, Agent, or Firm*—Sughrue, Mion, Zinn, Macpeak & Seas, PLLC

[57] ABSTRACT

A semiconductor device is provided and contains a semiconductor substrate, a first transistor, and a second transistor. The first transistor is formed on the semiconductor substrate and has a first gate electrode. The second transistor is formed on the semiconductor substrate and has a second gate electrode. Also, the thickness of the first gate electrode is different than the thickness of the second gate electrode. Also, a method for forming the semiconductor device is provided.

14 Claims, 8 Drawing Sheets

1

SEMICONDUCTOR DEVICE AND SEMICONDUCTOR DEVICE MANUFACTURING METHOD

This is a divisional of application Ser. No. 09/092,076 filed Jun. 5, 1998, the disclosure of which is incorporated herein by reference.

FIELD OF THE INVENTION

The present invention relates to a semiconductor device and method for manufacturing the semiconductor device. In particular, the present invention relates to a PN gate type CMOS integrated circuit which uses an $N^+$ type silicon film as the gate electrode of an NMOS transistor and which uses a $P^+$ type silicon film for the gate electrode of a PMOS transistor. Also, the present invention relates to the method of manufacturing the PN gate type CMOS integrated circuit.

BACKGROUND OF THE INVENTION

Manufacturing non-uniform surface channel type MOS transistors has less effect on the characteristics of the transistors than manufacturing non-uniform buried channel type MOS transistors. As a result, reducing a threshold voltage and heightening the driving capability in the surface channel type MOS transistor is easier, and thus, the surface channel type MOS transistor is better suited for developing smaller and faster LSI circuits. In order to form surface channel type CMOS transistors, an NMOS transistor and a PMOS transistor are formed. Also, an $N^+$ type silicon film is used as the gate electrode of the NMOS transistor, and a $P^+$ type silicon film is used as the gate electrode of the PMOS transistor. In order to understand the benefits of the present invention, two conventional devices will be described.

FIG. 5 shows the cross-sectional structure of a conventional CMOS transistor formed on a N type silicon substrate 2. Specifically, a P type well 3 formed in an N type silicon substrate 2, and an NMOS transistor is formed on the P type well 3. Also, the gate electrode 10 of the NMOS transistor is made of $N^+$ polycrystalline silicon. Also, a PMOS transistor is formed on the N type silicon substrate 2, and the gate electrode 12 of the PMOS transistor is made of $P^+$ polycrystalline silicon.

The method for manufacturing the device shown in FIG. 5 is illustrated in FIGS. 6(a) to 6(c). As shown in FIG. 6(a), the N type silicon substrate 2 is provided, and a P type well 3 is formed in the substrate 2 by a well-known method. Then, a device isolation oxide film 5 and a gate oxide film 6 are formed over the substrate 2 and P type well 3. Afterwards, a polycrystalline silicon film 7 is grown entirely over the oxide films 5 and 6, and a metal film 25 (e.g. Ti) is grown entirely over the silicon film 7. Then, a patterned photoresist 26 is placed over the metal film 25, and portions of the metal film 25 and the polycrystalline silicon film 7 are removed via photolithography and etching techniques by using the photoresist 26 as a mask.

As shown in FIG. 6(b), the photoresist 26 is removed, a photoresist 27 is formed over the PMOS transistor region of the device. Then, arsenic ions $As^+$ are implanted into the P type well 3 and the polycrystalline silicon film 7 in the NMOS transistor region. When the ions $As^+$ are implanted, impurities pierce through the metal film 25 and are implanted into the polycrystalline silicon film 7. As a result, film 7 is transformed into an $N^+$ polycrystalline silicon film to form the gate electrode 10 of the NMOS transistor. Also, the implanted ions $As^+$ form a source/drain region 9 in the P type well 3.

2

As shown in FIG. 6(c), the photoresist 27 is removed, and a photoresist 28 is formed over the NMOS transistor region. Afterwards, boron ions $B^+$ are implanted into the substrate 2 and polycrystalline silicon film 7 in the PMOS transistor region. When the ions $B^+$ are implanted, impurities pierce through the metal film 25 and are implanted into the polycrystalline silicon film 7. Thus, the film 7 is transformed into a $P^+$ polycrystalline silicon film to form the gate electrode 12 of the PMOS transistor. Also, the ions $B^+$ implanted in the substrate 2 form a source/drain region 11.

Subsequently, a heat treatment is conducted to activate the impurities in the source/drain regions 9 and 11 and the gate electrodes 10 and 12. As a result, the manufacture of the device shown in FIG. 5 is completed.

Normally, in order to improve the performance of the transistors, a depletion layer must be prevented from being formed in the gate electrodes 10 and 12 when a bias is applied to the gate electrodes 10 and 12. In order to prevent the formation of the depletion layer, high concentrations of impurities must be implanted in the region of the gate electrode 10 which comes in contact with the gate oxide film 6, and a heat treatment must be conducted after the ion implantation. In the conventional manufacturing method discussed above, impurities (i.e. the arsenic ions $As^+$ or boron ions $B^+$) are implanted into the films 6 and 7 to form the source/drain region 9 (or 11) of the NMOS (or PMOS) transistor and are simultaneously added to the polycrystalline silicon film 7 to form the gate electrode 10 (or 12).

The boron ions $B^+$ used to form the source/drain region 11 of the PMOS transistor have a low mass number, and thus boron is easily implanted deep into silicon. As a result, if the boron ions $B^+$ implanted into the polycrystalline silicon film 7 are introduced into the gate oxide film 6 during the ion implantation and the subsequent heat treatment, the reliability of the gate oxide film 6 dramatically decreases. Thus, the characteristics of the transistor become extremely non-uniform due to the manufacturing non-uniformity.

Meanwhile, arsenic ions $As^+$ have a high mass number and therefore, are used to form a shallow junction when the source/drain region 9 of the NMOS transistor has a gate length on the order of less than a micron. Accordingly, if the polycrystalline silicon film 7 is relatively thick, a sufficient amount of arsenic ions $As^+$ does not reach the region of the gate electrode 10 which comes into contact with the gate oxide film 6 below the polycrystalline silicon film 7. As a result, the gate electrode 10 is depleted of impurities, and the driving capability of the NMOS transistor is lowered.

In the above manufacturing method, the polycrystalline silicon film 7 used for the NMOS transistor and the polycrystalline silicon film 7 used for the PMOS transistor have the same thickness. Therefore, thickness of the polycrystalline silicon film 7 for both the NMOS transistor and the PMOS transistor must be optimized to account for the above effects that the thickness of the film 7 has on both the NMOS and PMOS transistors. However, if the acceleration voltage of ion implantation is adjusted based on thicknesses of the gate electrodes in order to prevent the boron ions $B^+$ from becoming implanted too deeply in the PMOS transistor and to prevent the gate electrode 10 in the NMOS transistor from being depleted, the depths and concentrations of the impurities in the source/drain regions 9 and 11 of the transistors varies and severely and adversely influences the characteristics of the NMOS transistor and the PMOS transistor. Thus, if the gate electrode 10 (or 12) and the source/drain region 9 (or 11) are formed simultaneously, optimizing the characteristics of the gate electrodes 10 and 12 for both the NMOS transistor and the PMOS transistor is difficult.

The above description refers to an example of a MOS transistor having a polyside gate structure in which a gate electrode is processed after the polycrystalline silicon film 7 and the metal film 25 are formed. The same problem also occurs in a MOS transistor having a saliside structure in which only a polycrystalline silicon film is used as a gate electrode until a source/drain region is formed, and then, the surfaces of the gate electrode and the source/drain region are formed into metal silicide.

A method for manufacturing CMOS transistors which attempts to avoid the above problems is disclosed in Japanese Unexamined Patent Publication No. 62-281462. In particular, ions are not implanted into a polycrystalline silicon film 7 to form the gate electrode 10 (or 12) when ions are implanted to form the source/drain region 9 (or 11). A description of the method will be described below in conjunction with FIGS. 7(a) to 7(c) and FIGS. 8(a) to 8(b).

As shown in FIG. 7(a), an N type silicon substrate 2 is provided, and a P type well 3 is formed on the substrate 2, Then, a device isolation oxide film 5 and a gate oxide film 6 are formed on the substrate 2 and the well 3, and a polycrystalline silicon film 7 is grown on the entire surface. Afterwards, a patterned photoresist 29 is formed over the polycrystalline silicon film 7, and phosphorous and arsenic ions $P^+$ and $As^+$ are implanted into a region of the film 7 which is slightly wider than the gate electrode of the NMOS transistor to transform the region into an $N^+$ type region 10.

As shown in FIG. 7(b), the photoresist 29 is removed, and a patterned photoresist 30 is formed over the polycrystalline silicon film 7. Then, boron ions $B^+$ are implanted into a region of the film which is slightly wider than the gate electrode of the PMOS transistor to transform the region into a $P^+$ type region 12.

As shown in FIG. 7(c), the photoresist 30 is removed, and a metal film 25 is formed over the entire surface of the polycrystalline silicon film 7. Then, a patterned photoresist 26 is formed over the metal film 25 and the polycrystalline silicon film 7, and portions of the films 25 and 7 are removed via photolithography and etching techniques by using the photoresist 26 as a mask. Thus, the gate electrode 10 having an $N^+$ polycrystalline silicon film is formed, and the gate electrode 12 having a $P^+$ polycrystalline silicon film is formed. The photoresist 26 is formed such that it has a slightly smaller width than the regions 10 and 12 of the film 7 into which the impurities-are implanted.

As shown in FIG. 8(a), the photoresist 26 is removed, and a photoresist 27 is formed over the PMOS transistor region. Then, phosphorous ions $P^+$ and arsenic ions $As^+$ are implanted into the P type well 3 to form the source/drain region 9 of the NMOS transistor. At this time, ions $P^+$ and $As^+$ are also implanted into the gate electrode 10.

As shown in FIG. 8(b), the photoresist 27 is removed, and a photoresist 28 is formed over the NMOS transistor region. Then, boron ions $B^+$ are implanted into the substrate 2 to form the source/drain region 11 of the PMOS transistor. At this time, ions $B^+$ are also implanted into the gate electrode 12. Afterwards, a heat treatment is conducted to activate the impurities in the source/drain regions 9 and 11.

In the conventional device and method shown in FIGS. 5 and 6, ions are implanted into the source/drain region of a transistor and are simultaneously implanted into the gate electrode of the transistor. As a result, obtaining desired transistor characteristics while preventing the deterioration of the performance of the gate electrode has been difficult.

Also, in the conventional method shown in FIGS. 7 and 8, the ions are implanted in the gate electrode of a transistor and are separately implanted into the source/drain region of the transistor. However, such method has two major disadvantages.

First, processing the polycrystalline silicon film 7 to form the gate electrodes 10 and 12 is difficult. As described above in conjunction with FIG. 7(c), the polycrystalline silicon film 7 contains three distinct regions: (11) a region in which no impurities are implanted, (2) the $N^+$ type region 10, and (3) the $P^+$ type: region 12. Also, each of the three regions are simultaneously etched during the method to form the gate electrodes 10 and 12. However, the etching rates of the regions into which impurities are implanted are substantially faster than the etching rate of the regions in which no impurities are implanted. Therefore, after the etching of the region with no impurities is completed, the $P^+$ type and $N^+$ type regions 10 and to 12 are over-etched, and thus, the characteristics and reliability of the transistor is severely and adversely affected. Also, the separation characteristics of the transistor is adversely affected. For example, when the $P^+$ type and $N^+$ regions 10 and 12 are over-etched, the gate electrodes 10 and 12 become thinner, the performance of the transistors is lowered due to the deteriorated shape of the electrodes 10 and 12, the gate oxide film 6 is damaged, and the reliability of various features of the transistor (e.g. the hot carrier resistance of the transistor) is lowered. Such problems are particularly obvious in the NMOS transistor which receives the phosphorous and arsenic ions $P^+$ and $As^+$ because the etching rate of polycrystalline silicon containing phosphorous is much higher than the etching rate of a polycrystalline silicon containing no ions.

The second problem with the method described above is that the time required to manufacture the transistors is substantially increased. Specifically, in order to add N type impurities and P type impurities to predetermined positions of the polycrystalline silicon film 7, to two masking steps must be added to the manufacturing steps shown in FIG. 5. (See FIGS. 7(a) and 7(b)). As a result, the cost to manufacture the transistors is increased.

SUMMARY OF THE INVENTION

An object of the present invention is to manufacture reliable CMOS transistors with fewer manufacturing steps.

Another object of the present invention is to ensure reliability and optimize the functionality of an NMOS transistor and an PMOS transistor in the CMOS transistors without increasing the number of masking steps during the manufacturing process.

In order to achieve the above and other objects, a semiconductor device is provided. The device comprises: a semiconductor substrate; a first transistor formed on said semiconductor substrate and having a first gate electrode; and a second transistor formed on said semiconductor substrate and having a second gate electrode, wherein a first thickness of said first gate electrode is different than a second thickness of said second gate electrode.

In order to additionally achieve the above and other objects, a method for manufacturing a semiconductor device is provided. The method comprises the steps of: (a) forming a semiconductor film having a first area portion and a second area portion over a semiconductor substrate, wherein said first area portion is disposed over a first area of said semiconductor substrate and said second area portion is disposed over a second area of said semiconductor substrate; (b) providing a mask layer over said second area portion of said semiconductor film; (c) changing a thickness of said first area portion of said semiconductor film while said mask layer is provided over said second area portion of said semiconductor film to produce a changed first area portion; (d) forming a first transistor over said first area of said semiconductor substrate, wherein said first transistor comprises a first conductive type gate electrode formed with at least some of said changed first area portion of said semiconductor film; and (e) forming a second transistor over said second area of said semiconductor substrate, wherein said second transistor comprises a second conductive type gate electrode formed with at least some of said second area portion of said semiconductor film.

In order to further achieve the above and other objects, a method for manufacturing a semiconductor device is provided. The method comprises the steps of: (a) forming a gate oxide film and a silicon film on a semiconductor substrate having a first transistor region and a second transistor region, wherein a first silicon film portion is disposed over said first transistor region and a second silicon film portion is disposed over said second transistor region; (b) changing a film thickness of said first silicon film portion without changing a film thickness of said second silicon film portion; (c) patterning said first silicon film portion to form a first gate electrode disposed over said first transistor region and patterning said second silicon film portion to form a second gate electrode disposed over said second transistor region; and (d) simultaneously implanting first ions into said first gate electrode and said first transistor region of said semiconductor substrate to form a first source and drain region in said first transistor region.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENTS

The following description of the preferred embodiments discloses specific configurations, components, and values. However, the preferred embodiments are merely examples of the present invention, and thus, the specific features described below are merely used to more easily describe such embodiments and to provide an overall understanding of the present invention. Accordingly, one skilled in the art will readily recognize that the present invention is not limited to the specific embodiments described below. Furthermore, the descriptions of various configurations, components, and values of the present invention which would have been known to one skilled in the art are omitted for the sake of clarity and brevity.

Figure 1:
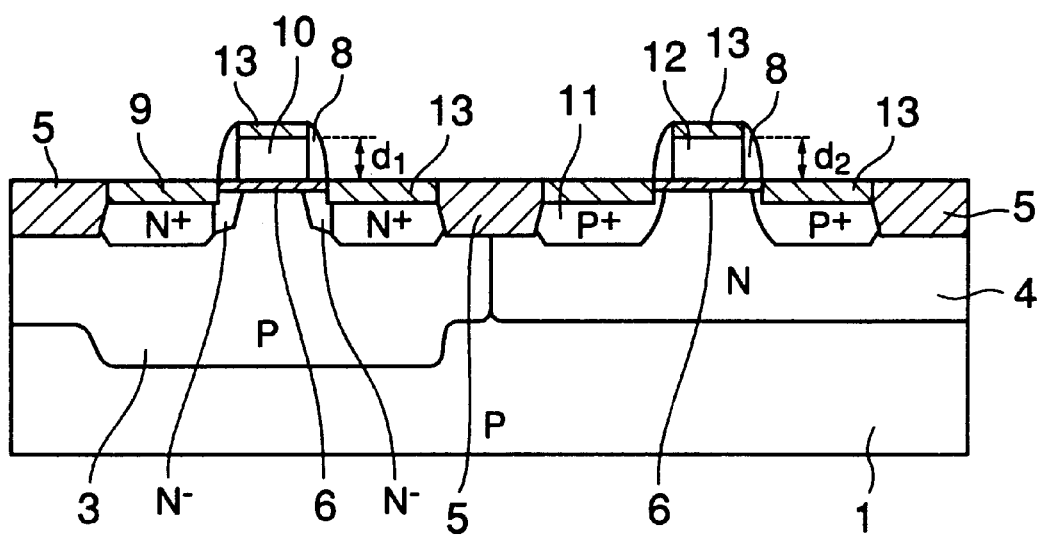
FIG. 1 is a cross-sectional view of a semiconductor device according to a first embodiment of the present invention.

FIG. 1 illustrates a cross-sectional view of semiconductor device according to a first embodiment of the present invention. As shown in the figure, the device comprises a P type silicon substrate 1, and a P type well 3 and an N type well 4 are formed on the substrate 1. An NMOS transistor is formed on the P type well 3, and an PMOS transistor is formed on the N type well 4. Also, the gate electrode 10 of the NMOS transistor is made of an $N^+$ polycrystalline silicon film, and the gate electrode 12 of the PMOS transistor is made of a $P^+$ polycrystalline silicon film. Also, the gate electrode 10 (i.e. the $N^+$ polycrystalline silicon film) has a thickness d1, and the gate electrode 12 (i.e. of the $P^+$ polycrystalline silicon film) has a thickness d2. Furthermore, the thickness d1 is less than the thickness d2. Also, the source/drain region 9 of the NMOS transistor is formed from an $N^+$ diffused layer region, and a metal silicide layer 13 is formed on such region 9. Also, the source/drain region 11 of the PMOS transistor is formed from an $P^+$ diffused layer region, and a metal silicide layer 13 is formed on such region 11. In addition, metal silicide layers 13 are respectively formed on the gate electrodes 10 and 12 of the NMOS and PMOS transistors.

Figure 2A:
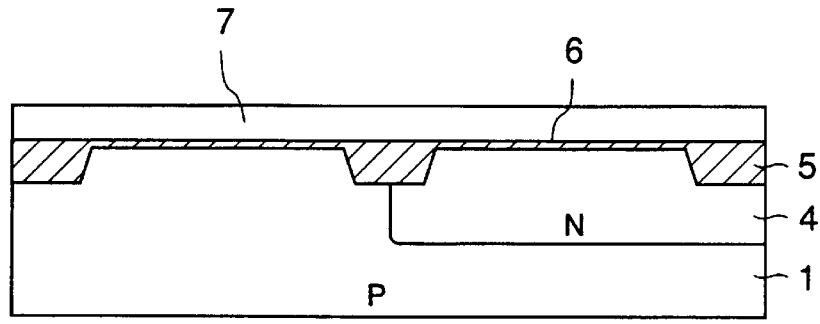
FIGS. 2(a) to 2(d) illustrate a method for manufacturing the semiconductor device shown in FIG. 1.

FIGS. 2(a) to 2(d) show an illustrative example of a method for manufacturing the device illustrated in FIG. 1. As shown in FIG. 2(a), the P type silicon substrate 1 having a boron density of $10^{15}/cm^3$ to $10^{16}/cm^3$ is provided. Then, a device isolation oxide film 5 and an initial oxide film (not shown) are formed over the substrate 1 via known techniques. The film 5 is a silicon oxide film having a thickness of about 400 nm, and the initial oxide film (not shown) has a thickness of about 20 nm. Afterwards, a photoresist (not shown) is formed over a region where the NMOS transistor is to formed, and phosphorous ions $P^+$ are implanted into the region where the PMOS transistor is to be formed. As a result, the N type well 4 is formed. The ion as implantation of the phosphorous ions $P^+$ is conducted three times. First, the ions $P^+$ are implanted at an acceleration voltage of 800 KV and a dose of $2\times10^{13}/cm^2$. Then, they are implanted at an acceleration voltage of 240 KV and a dose of $5\times10^{12}$ $cm^2$. Afterwards, the ions $P^+$ are implanted at an acceleration voltage of 70 KV and with a dose of $1\times10^{12}/cm^2$. The first ion implantation is performed to ensure the depth of the N type well 4. The second ion implantation is performed to isolate the PMOS transistor and to prevent punch through of the PMOS transistor. Punchthrough occurs when current flows from the drain region, through the depletion layer in the N-type well 4, and to the source region of the PMOS transistor. Finally, the third ion implantation is performed to adjust the threshold voltage of the MOS transistor to obtain the desired characteristics of the PMOS transistor. Based on the ion implantation, the phosphorous concentration on the surface of the N type well 4 is $1\times10^{17}/cm^3$ to $5\times10^{17}/cm^3$. After the ions $P^+$ are implanted, the photoresist (not shown) is removed and the initial oxide film (not shown) is removed via a wet etching process during which the thickness of the device isolation oxide film 5 is reduced to about 380 nm. Then, a gate oxide film 6 having a thickness of about 5 nm is formed by a well-known technique. Afterwards, amorphous silicon having a thickness of about 200 nm is grown over the device 10, isolation oxide film 5 and the gate oxide film 6, and a heat treatment is conducted at about 800° C. to form the polycrystalline silicon film 7 and to activate the implanted phosphorous ions P+ in the N type well 4. However, depending on the desired properties of the device, the amorphous silicon may possibly not be subjected to the heat treatment to convert it into a polysilicon layer 7.

Figure 2B:
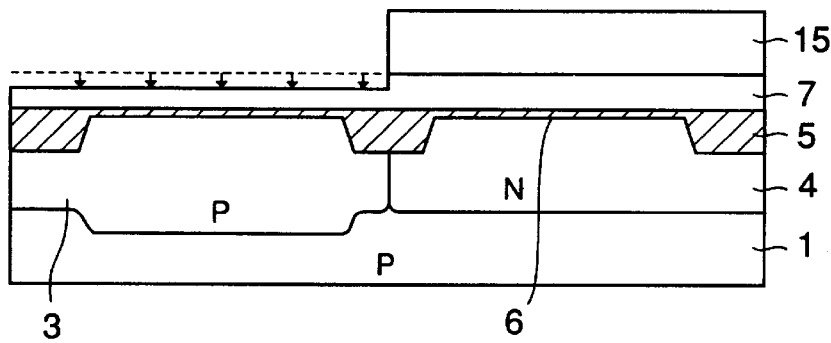

As shown in FIG. 2(b), a photoresist 15 is formed over a region where the PMOS transistor is to be formed, and boron ions B+ are implanted into the region where the NMOS transistor is to be formed while using the photoresist 15 as a mask. As a result, the P type well 3 is formed in the NMOS transistor region. The ion implantation of the boron ions B+ is conducted three times. First, the ions B+ are implanted at an acceleration voltage of 400 KV and a dose of $3 \times 10^3/cm^2$. Then, they are implanted at an acceleration voltage of 200 KV and a dose of $5 \times 10^{12}/cm^2$. Afterwards, the ions B+ are implanted at an acceleration voltage of 80 KV and a dose of $8 \times 10^{12}/cm^2$. The reason for performing the ion implantation three times is that same as the reason why it was performed three times to form the N type well 4. As a result of the ion implantation, the concentration of boron ions B+ on the surface of the P type well 3 is $1 \times 10^{17}/cm^3$ to $5 \times 10^7/cm^3$. Then, the polycrystalline silicon film 7 is etched to reduce its thickness about 50 nm while using the photoresist 15 as a mask, and a heat treatment is conducted at about 800° C. to activate implanted boron ions B+. At such time, the difference between the thickness of the polycrystalline silicon film 7 in the NMOS transistor region and the PMOS transistor region is about 50 nm.

Figure 2C:
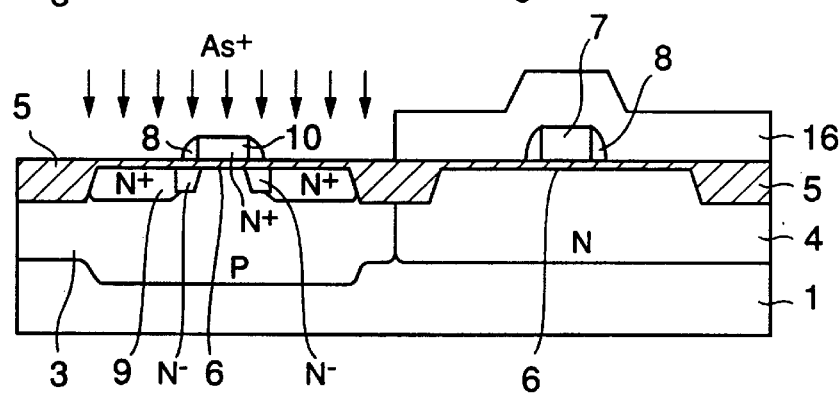

As shown in FIG. 2(c), the polycrystalline silicon film 7 is patterned via a known technique to designate portions at which the gate electrodes 10 and 12 of the NMOS and PMOS transistors will be formed. Then, the patterned polycrystalline silicon film 7 is etched so that only the portions of the film 7 corresponding to the gate electrodes 10 and 12 remain. If the over-etching conditions are optimized by adjusting the etching selection ratio of the gate oxide film 6 to the polycrystalline silicon film 7 or the like, the influence that the difference in thickness of the polycrystalline silicon film 7 has on the characteristics and reliability of the transistors can be reduced to a relatively insignificant level. For example, the etching rate of the polycrystalline silicon film 7 is much greater (e.g. 1000 times greater) than the etching rate of the oxide film 6. Since the thickness of the film 7 in the NMOS transistor region is 50 nm less than the thickness of the film 7 in the PMOS transistor region, the film 7 in the NMOS transistor region will be completely etched when 50 nm of the film 7 in the PMOS transistor region remain. Therefore, some of the oxide film 6 in the NMOS transistor region will be etched while the remaining 50 nm of the film 7 in the PMOS transistor region is etched. However, since the ratio of the etching rates of the film 7 to the film 6 is 1000:1, only 0.5 nm of the film 6 will be etched while the remaining 50 nm of the film 7 is etched. The etching of such a small amount of the film 6 is relatively insignificant.

Afterwards, a photoresist (not shown) is formed in the PMOS transistor region, and arsenic or phosphorous ions As+ or P+ are implanted into the NMOS transistor region at an acceleration voltage of 20 KV and a dose of $2 \times 10^{13}/cm^2$. Then, ions are implanted to form N− regions in the P-type well 3. Afterwards, the photoresist is removed, an oxide film (not shown) having a thickness of about 60 nm is grown on the entire surface, and an etch-back process is performed on the oxide film (not shown) to produce the sidewall oxide film 8. Subsequently, a photoresist 16 is provided over the PMOS transistor region, and arsenic ions As+ are implanted again at an acceleration voltage of 40 KV and a dose of $1 \times 10^{15}/cm^2$ to $5 \times 10^{15}/cm^2$. As a result, the polycrystalline silicon film 7 on the NMOS transistor region is transformed into the gate electrode 10 formed of N+ polycrystalline silicon film. Also, the source/drain region 9 of the NMOS transistor is formed and has a lightly doped drain ("LDD") structure. Specifically, the portion of the region 9 under the side wall oxide films 8 is an N− portion, and the portion of the source/drain region which is not under the films 8 is an N+ region.

Figure 2D:
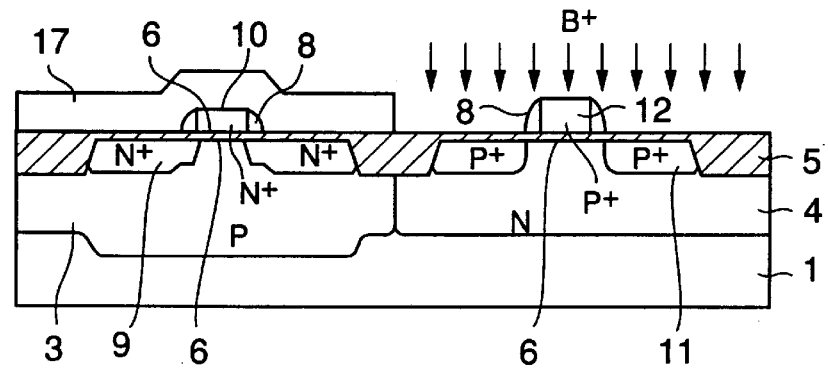

As shown in FIG. 2(d), a photoresist 17 is formed over the NMOS transistor region, and boron ions B+ are implanted in the PMOS transistor region to form the source/drain region 11. The boron ions B+ are implanted at an acceleration voltage of about 10 KV and a dose of $1 \times 10^{15}/cm^2$ to $5 \times 10^{15}/cm^2$. Also, when the ions B+ are implanted, the polycrystalline silicon film 7 in the PMOS transistor region is transformed into the gate electrode 12 formed of P+ polycrystalline silicon film. In the embodiment described above, the PMOS transistor does not have an LDD structure. However, a PMOS transistor having an LDD structure may be formed if required.

Afterwards, a lamp annealing process may be conducted at about 1000° C. to recover crystallization and re-distribute impurities. By performing the lamp annealing process, concentrations of impurities which are electrically activated in regions of the gate electrode 10 (i.e. the N+ polycrystalline silicon film) and the gate electrode 12 (i.e. the P+ polycrystalline silicon film) which come into contact with the gate oxide film 6 are sufficiently increased. Then, a cobalt silicide layer 13 having a thickness of about 20 nm is formed on the surface of the silicon using a known technique to complete the manufacture of the structure shown in FIG. 1. Subsequently, a base interlayer film, a contact, and an electrode are formed by a known technique to produce the finalized CMOSLSI.

Figure 5:
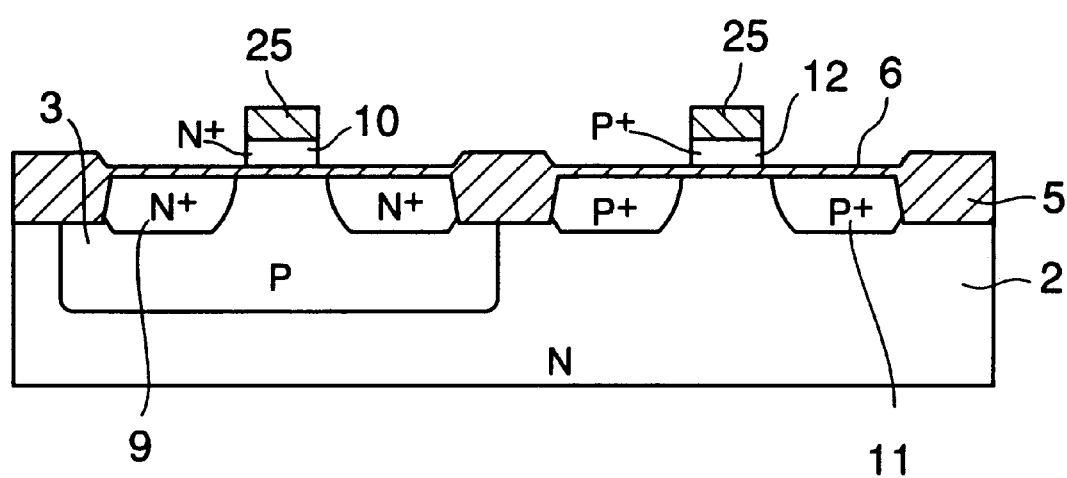
FIG. 5 is a cross-sectional view of a conventional semiconductor device.

In the embodiment described above, the thickness of the gate electrode 10 of the NMOS transistor differs from the gate electrode 12 of the PMOS transistor. As a result, even if ion implantation is conducted during the formation of both the gate electrode and the source/drain region, the desired impurity distribution of the source/drain region as well as a reliable gate electrode can be simultaneously obtained. Furthermore, in comparing the manufacturing process of the present embodiment with the conventional manufacturing process of the device in FIG. 5, the process of the present embodiment only requires one extra step of changing the thickness of the polycrystalline silicon film 7 as shown in FIG. 2(b).

Figure 3:
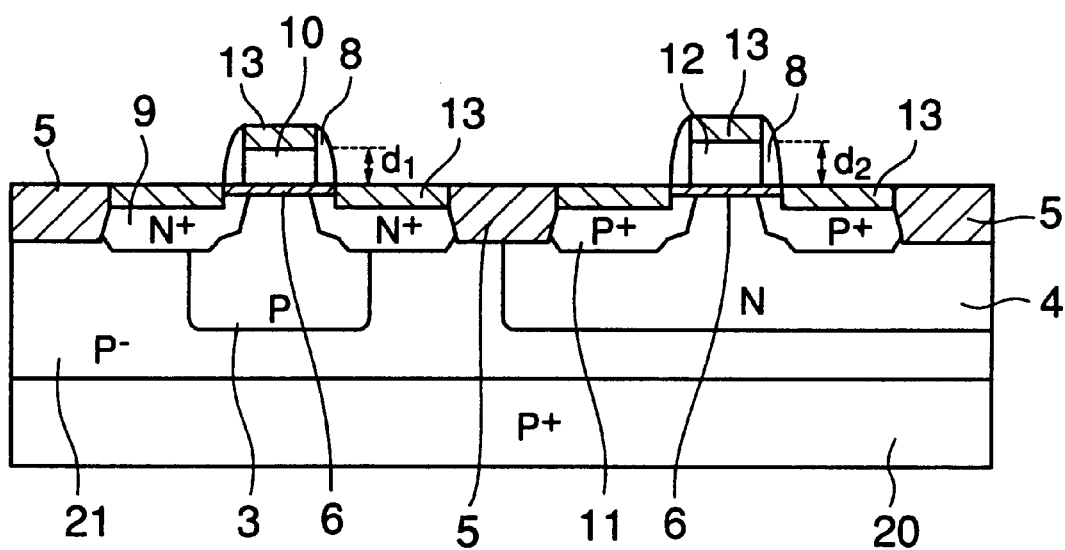
FIG. 3 is a cross-sectional view of a semiconductor device according to a second embodiment of the present invention.

In the first embodiment, a P type well 3 is provided in a region of the silicon substrate 1 containing the N+ diffused layer region 9. FIG. 3 illustrates a second embodiment of the present invention which modifies such structure in order to further reduce the drain capacity in the CMOS transistors. In the second embodiment; a P+ type silicon substrate 20 is provided, and a P− type silicon layer 21 is formed on the P+ type silicon substrate 20. Also, an NMOS transistor is formed on the P− type silicon layer 21, and a P type well 3 is provided in an inner part of the outer peripheral portion of the source/drain region 9 of the NMOS transistor. Such a structure is created by limiting regions in which the photoresist 15 shown in FIG. 2(b) in the first embodiment is patterned at the periphery of the gate electrodes.

FIGS. 4(a) to 4(d) illustrate a method of manufacturing a semiconductor device in accordance with a third embodiment of the present invention. In this embodiment, phosphorous is added to the polycrystalline silicon film 7 in the PMOS transistor region described in the first embodiment to increase the etching rate of the polycrystalline silicon film.

Figure 4A:
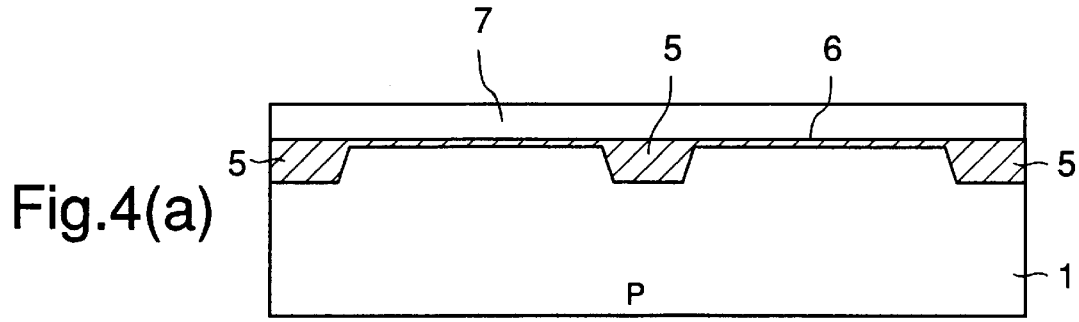
FIGS. 4(a) to 4(d) illustrate a method for manufacturing the semiconductor device in accordance with a third embodiment of the present invention.

As shown in FIG. 4(a) and as in the first embodiment, device isolation oxide films 5 and a gate oxide film 6 are formed on a P type silicon substrate 1. The device isolation oxide films 6 contain a silicon oxide film and have a thickness of about 400 nm, and the gate oxide film 6 has a thickness of about 5 nm. Also, the P type silicon substrate 1 has a boron density of about $1 \times 10^{15}/\text{cm}^3$ to $1 \times 10^{16}/\text{cm}^3$. Then, a polycrystalline silicon film 7 is formed on the oxide films 5 and 6.

Figure 4B:
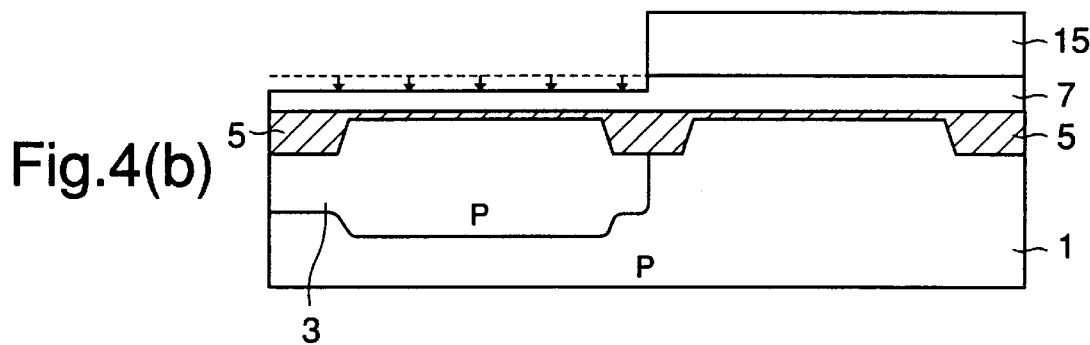

Then, as shown in FIG. 4(b), a photoresist 15 is formed over the PMOS transistor region, and a P type well 3 is formed by implanting boron ions $B^+$ in the substrate 1 while using the photoresist 15 as a mask. The boron ions $B^+$ are implanted into the substrate 1 three times in the same manner that ions $B^+$ are implanted into the substrate 1 of the first embodiment. Then, the polycrystalline silicon film 7 is etched by about 50 nm while using the photoresist 15 as a mask. Afterwards, the photoresist is removed.

Figure 4C:
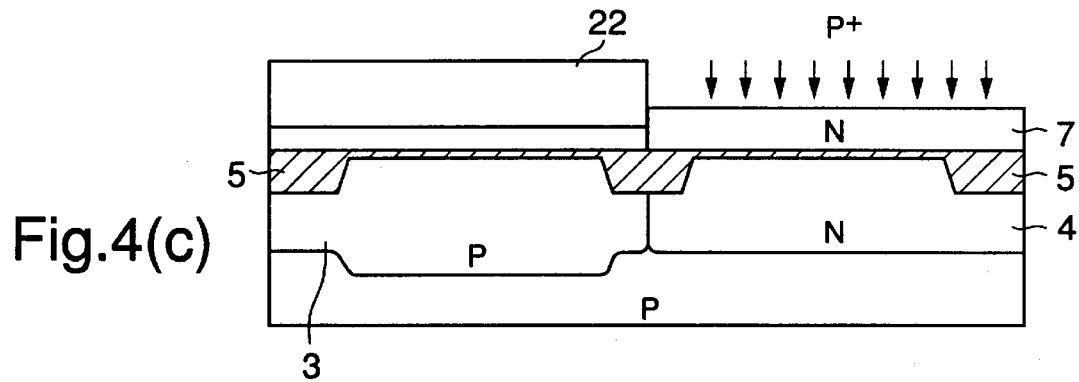

As shown in FIG. 4(c), a photoresist 22 is formed on the NMOS transistor region, and phosphorous ions $P^+$ are implanted into the polycrystalline silicon film 7 while using the photoresist 22 as a mask to form an N type well 4. The ion implantation is conducted three times. First, the ions $P^+$ are implanted at an acceleration voltage of 1 MV and a dose of $2 \times 10^{13}/\text{cm}^2$. Then, they are implanted at an acceleration voltage of 350 KV and a dose of $5 \times 10^{12}/\text{cm}^2$ while using the photoresist 22 as a mask. Afterwards, the ions $P^+$ are implanted at an acceleration voltage of 220 KV and a dose of $7 \times 10^{12}/\text{cm}^2$. Then, in order to convert the surface of the polycrystalline silicon film 7 into an N type surface, phosphorous ions $P^+$ are implanted again at an acceleration voltage of 30 KV and a dose of about $5 \times 10^{14}/\text{cm}^2$. Afterwards, the photoresist 22 is removed, and a lamp annealing process is performed at about 1000° C. to activate the ion injected impurities.

Figure 4D:
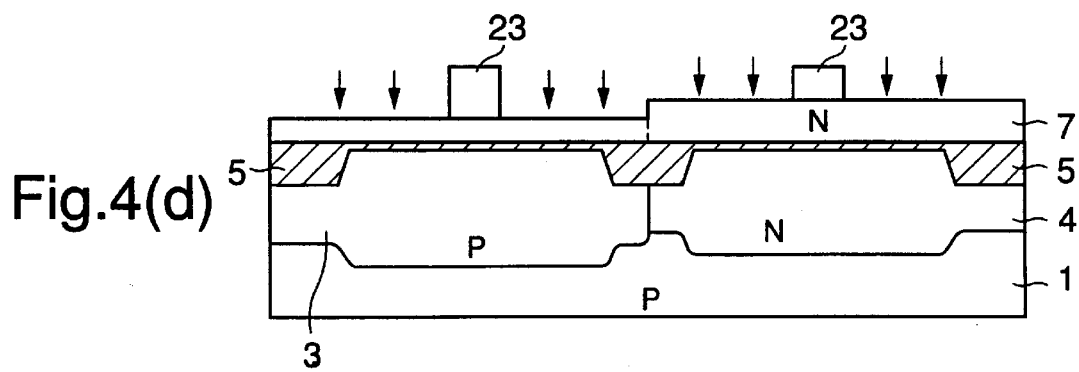

As shown in FIG. 4(d), the gate electrodes for the NMOS transistor and the PMOS transistor are created. Specifically, a patterned mask material 23 comprising an antireflection film and a photoresist is formed on the polycrystalline silicon film 7. Then, the film 7 is etched while using the mask material 23 used as a mask. The remaining steps for producing the CMOS transistors of the third embodiment are the same or similar to the corresponding steps performed in the first embodiment.

The third embodiment is advantageous because the gate electrodes can be easily made and processed. Also, in the embodiment, the polycrystalline silicon film 7 in the NMOS transistor region is about 50 nm thinner than the film 7 in the PMOS transistor region. However, since the surface of the thicker film 7 in the PMOS transistor region is converted into an N type surface, the etching rate of the thicker film 7 is increased. As a result, the time required to etch the portions of the polycrystalline silicon film 7 in the NMOS transistor region and the film 7 in the PMOS transistor region is approximately equal. Also, the gate electrode 12 of the PMOS transistor is formed of the film 7 having the N type surface, but as the gate electrode 12 is made into a $P^+$ type surface by adding more boron ions $P^+$ to the electrode 12 during the ion implantation used to form the $P^+$ diffused layer region 11. (See FIG. 2(d)). Therefore, no problem results from transforming the polycrystalline silicon film 7 into an N type surface for the etching process.

As described above, the present invention is capable of ensuring the reliability of the NMOS and PMOS transistors and simultaneously improving the performance of the transistors.

According to the present invention, the thickness of the gate electrode of the NMOS transistor is made thinner than the gate electrode of the PMOS transistor. As a result, the performance of the NMOS transistor can be more easily improved while preventing a depletion layer from being formed in the gate electrode of the NMOS transistor. Meanwhile, the present invention prevents the boron from punching through the gate oxide film in the PMOS transistor. Therefore, the invention facilitates reducing the non-uniformities of the characteristics of the transistors and ensures the reliability of the transistors without deteriorating their performance.

For example, if a CMOSLSI is manufactured in accordance with the present invention and has a gate length of about 0.18 $\mu$m, the gate electrode of the NMOS transistor may have a thickness of 150 nm, and the gate electrode of the PMOS transistor may have a thickness of 200 nm. On the other hand, if a CMOSLSI is manufactured in accordance with a conventional method and has a gate length of about 0.18 $\mu$m, the gate electrodes of each of the NMOS transistor and the PMOS transistor may have a thickness of about 200 nm. Therefore, in the present invention, the driving capability of the NMOS transistor can be increased by about 15% while maintaining the performance and reliability of the PMOS transistor.

Figure 6A:
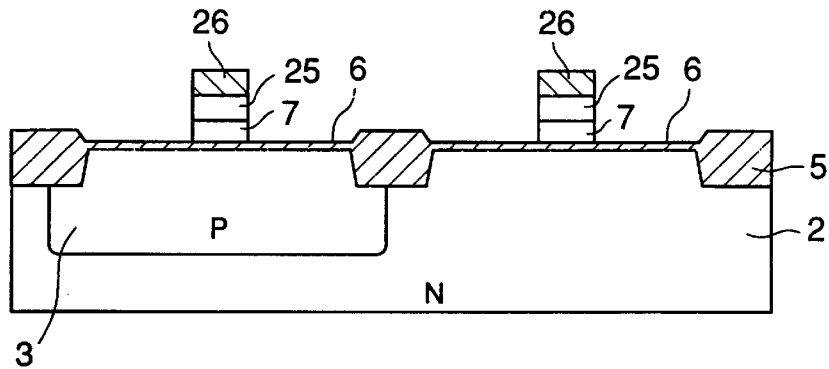
FIGS. 6(a) to 6(c) illustrate a method for manufacturing the semiconductor device shown in FIG. 5.
Figure 6B:
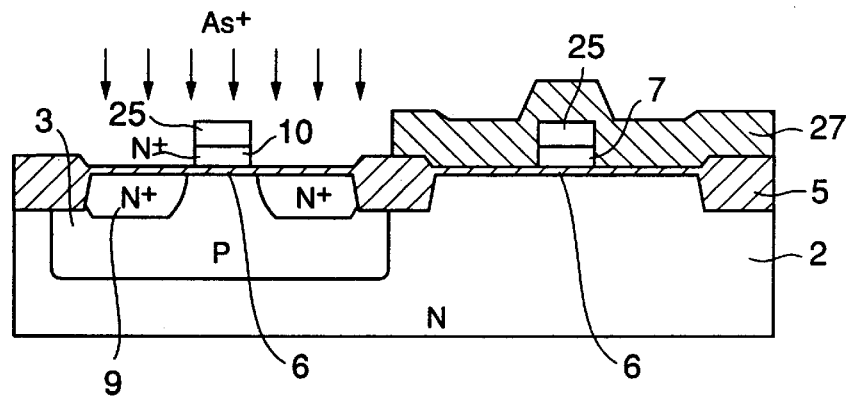
Figure 6C:
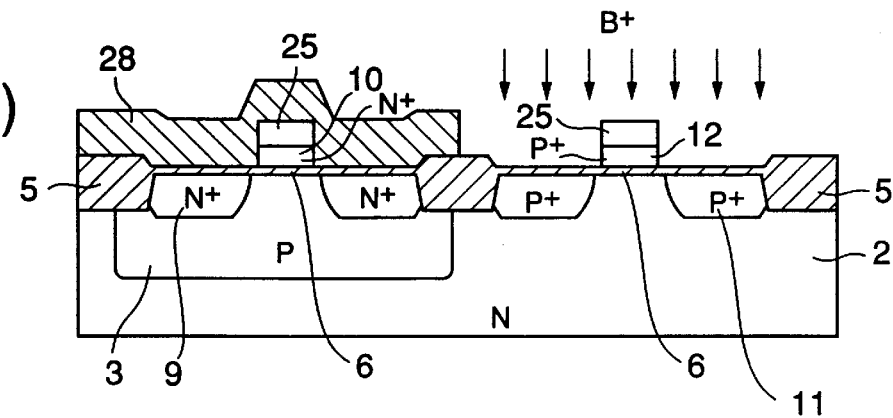

Moreover, according to the present invention, the polycrystalline silicon film used to form the gate electrode of the NMOS transistor is etched by using the same photoresist which is used as a mask to form the P type well in the substrate. As a result, the method of the present invention can produce a greatly improved semiconductor device by adding only one manufacturing step to the conventional method described above in conjunction with FIGS. 5 and 6.

Figure 7A:
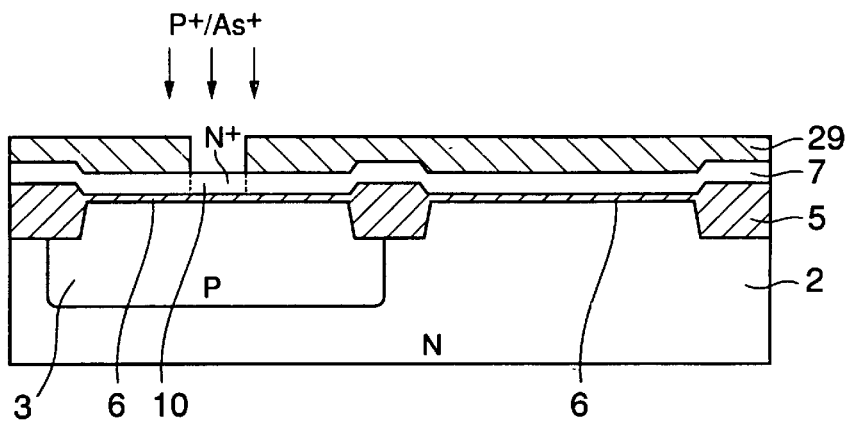
FIGS. 7(a) to 7(c) illustrate a first portion of method for manufacturing a second conventional semiconductor device.
Figure 7B:
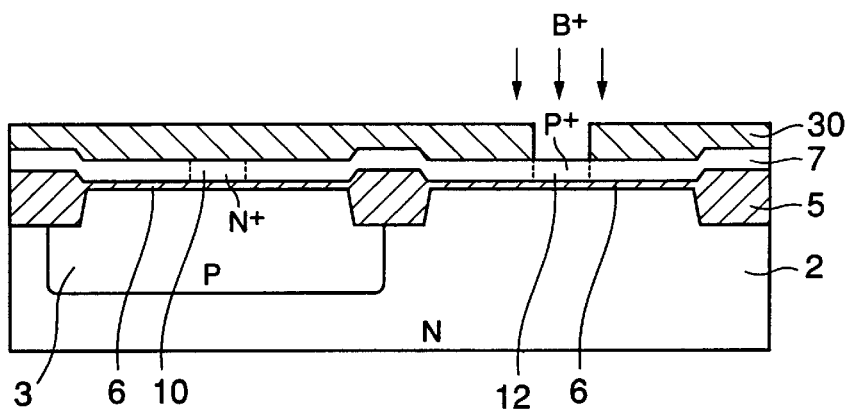
Figure 7C:
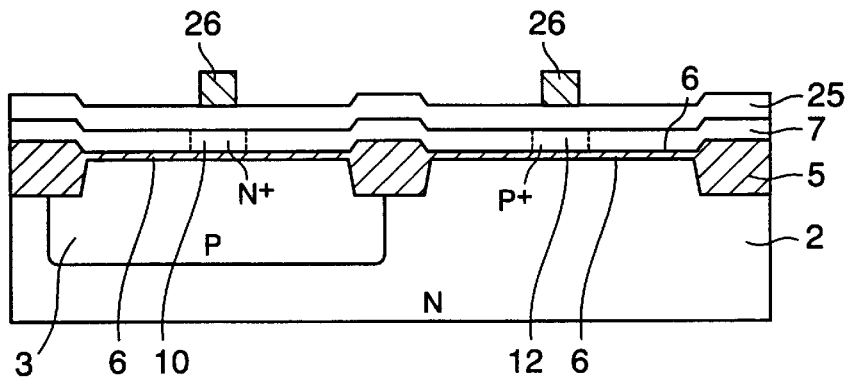
Figure 8A:
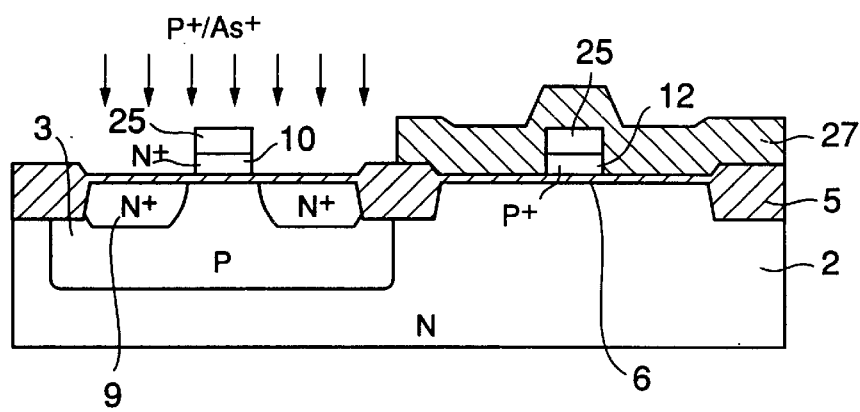
FIGS. 8(a) to 8(b) illustrate a second portion of method for manufacturing the second conventional semiconductor device.
Figure 8B:
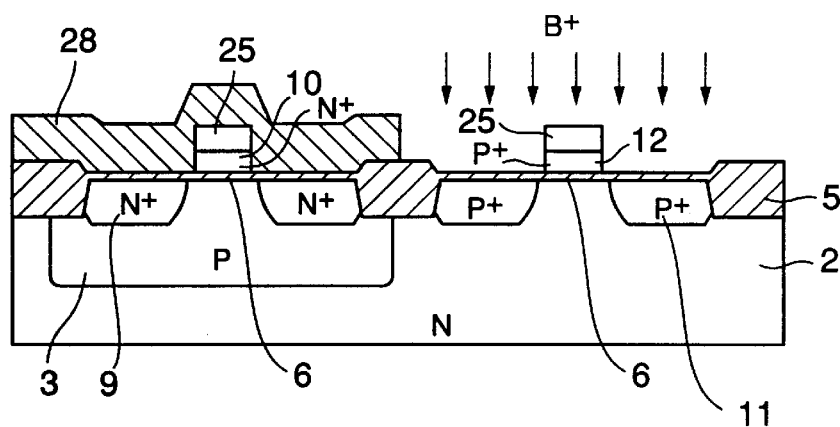

In addition, the method of the present invention is much superior to the conventional method described above in conjunction with FIGS. 7 and 8 because the present invention has all of the advantages of the conventional method and does not require the additional masking steps required in the conventional method. Also, the over-etching problem that occurs in the conventional method does not occur in the method of the present invention. (See FIGS. 7(a) and 7(b).)

The previous description of the preferred embodiments is provided to enable a person skilled in the art to make or use the present invention. Moreover, various modifications to these embodiments will be readily apparent to those skilled in the art, and the generic principles defined herein may be applied to other embodiments without the use of inventive faculty. Therefore, the present invention is not intended to be limited to the embodiments described herein but is to be accorded the widest scope as defined by the claims. For example, one skilled in the art will realize from reading the present application that the thicknesses of the gate electrodes 10 and 12 of the NMOS and PMOS transistors are determined to optimize the performance of the transistors. Therefore, depending on the specific application, the thickness of the gate electrodes 10 and 12 are not limited to 150 nm and 200 nm, respectively. Also, the polycrystalline silicon film used to form the gate electrode in the NMOS transistor may be made thicker than the polycrystalline silicon film used to form the gate electrode in the PMOS transistor. Such a situation would arise if the ions implanted into the PMOS transistor have a high mass number and are not easily implanted deep into silicon and if the ions implanted into the NMOS transistor have a low mass number and are easily implanted deep into silicon. In addition, a well having the same conductive type as the semiconductor substrate and/or the impurity diffused layer region having an LDD structure can be provided if necessary. Also, the types of ions used to form N type and P type impurity diffused layers can be appropriately selected.

What is claimed is:

1. A semiconductor device comprising:

a semiconductor substrate;

a first transistor formed on said semiconductor substrate and having a first gate electrode; and a second transistor formed on said semiconductor substrate and having a second gate electrode, wherein a first thickness of said first gate electrode is different than a second thickness of said second gate electrode, wherein said first transistor is an NMOS transistor and said second transistor is a PMOS transistor, wherein said first gate electrode of said NMOS transistor is made of an $N^+$ type polycrystalline silicon film and said second gate electrode of said PMOS transistor is made of a $P^-$ type polycrystalline silicon film, wherein said first transistor comprises a first source/drain region formed of an $N^+$ diffused layer region and said second transistor comprises a second source/drain region formed of an $P^+$ diffused layer region, wherein said semiconductor substrate is a $P^+$ type substrate, wherein a $P^-$ type layer is formed over said $P^+$ type substrate, wherein a P type well and an N type well are formed over said $P^-$ type layer, and wherein said first source/drain region is formed over said P type well and said second source/drain region is formed over said N type well.

2. The semiconductor device according to claim 1, wherein said P type well is formed in an inner part of an outer periphery portion of said first source/drain region.

3. A semiconductor device comprising:

a semiconductor substrate;

a first transistor formed on said semiconductor substrate and having a first gate electrode; and a second transistor formed on said semiconductor substrate and having a second gate electrode, wherein a first thickness of said first gate electrode is different than a second thickness of said second gate electrode, wherein said first gate electrode of said first transistor has a first conductivity type and said second gate electrode of said second transistor has a second conductivity type, wherein said first transistor comprises a first source/drain region having said first conductivity type and said second transistor comprises a second source/drain region having said second conductivity type, wherein said semiconductor substrate has said second conductivity type, wherein a semiconductor layer having said second conductivity type is formed over said semiconductor substrate and has a conductivity value that is different than a conductivity value of said semiconductor substrate, wherein a first well having said second conductivity type and a second well having said first conductivity type are formed over said semiconductor layer, wherein a conductivity value of said first well is different than a conductivity value of said semiconductor layer, and wherein said first source/drain region is formed over said first well and said second source/drain region is formed over said second well.

4. The semiconductor device according to claim 3, wherein said conductivity value of said semiconductor layer having said second conductivity type is lower than said conductivity value of said semiconductor substrate.

5. The semiconductor device according to claim 3, wherein said conductivity value of said semiconductor layer having said second conductivity type is lower than said conductivity value of said first well.

6. The semiconductor device according to claim 3, wherein said conductivity value of said first well is lower than said conductivity value of said semiconductor substrate.

7. The semiconductor device according to claim 3, wherein said conductivity value of said first well is lower than said conductivity value of said semiconductor substrate, and wherein said conductivity value of said semiconductor layer is lower than said conductivity value of said first well.

8. The semiconductor device according to claim 5, wherein said first well is formed in an inner part of an outer periphery portion of said first source/drain region.

9. The semiconductor device as claimed in claim 5, wherein said first transistor is an NMOS transistor and said second transistor is a PMOS transistor.

10. The semiconductor substrate as claimed in claim 5, wherein said first gate electrode and said second gate electrode are formed from a common semiconductor film from which portions are removed to produce said first gate electrode and said second gate electrode.

11. The semiconductor device according to claim 9, wherein said first gate electrode of said NMOS transistor is thinner than said second gate electrode of said PMOS transistor.

12. The semiconductor device according to claim 9, wherein said first gate electrode of said NMOS transistor is thicker than said second gate electrode of said PMOS transistor.

13. The semiconductor device according to claim 3, wherein said semiconductor substrate is a $P^+$ type substrate, said semiconductor layer is a $P^-$ type layer, and said first well is a P type well.

14. The semiconductor device according to claim 13, wherein said second well is an N type well, said first source/drain region is an $N^+$ type source/drain region, and said second source/drain region is a $P^+$ type source drain region.

* * * * *

UNITED STATES PATENT AND TRADEMARK OFFICE
CERTIFICATE OF CORRECTION

PATENT NO.: 6,049,113
DATED: April 11, 2000
INVENTOR(S): Akira SHIDA

It is certified that error(s) appears in the above-identified patent and that said Letters Patent is hereby corrected as shown below:

Column 4, line 7, delete "11" insert --1--.

Signed and Sealed this

Seventeenth Day of April, 2001

*Attest:*

NICHOLAS P. GODICI

*Attesting Officer*     *Acting Director of the United States Patent and Trademark Office*